US006968850B2

(12) United States Patent
Chan et al.

(10) Patent No.: US 6,968,850 B2
(45) Date of Patent: Nov. 29, 2005

(54) IN-SITU CLEANING OF LIGHT SOURCE COLLECTOR OPTICS

(75) Inventors: Michael Chan, Beaverton, OR (US); Robert Bristol, Portland, OR (US); Mark Doczy, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 213 days.

(21) Appl. No.: 10/197,628

(22) Filed: Jul. 15, 2002

(65) Prior Publication Data

US 2004/0007246 A1 Jan. 15, 2004

(51) Int. Cl.$^7$ ............................................. B08B 7/00
(52) U.S. Cl. .................... 134/902; 134/63; 134/1.1; 156/345.5
(58) Field of Search .................. 134/1.1, 63, 902; 156/345.5

(56) References Cited

U.S. PATENT DOCUMENTS

| | | | |
|---|---|---|---|
| 4,689,112 A | * | 8/1987 | Bersin ........................ 438/709 |
| 5,312,519 A | | 5/1994 | Sakai et al. |
| 5,336,366 A | * | 8/1994 | Cain et al. .................. 438/730 |
| 6,031,598 A | * | 2/2000 | Tichenor et al. ............. 355/67 |
| 6,153,044 A | | 11/2000 | Klebanoff et al. |
| 6,192,897 B1 | | 2/2001 | Klebanoff et al. |
| 6,450,116 B1 | * | 9/2002 | Noble et al. ............ 118/723 R |
| 6,533,952 B2 | | 3/2003 | Klebanoff et al. |
| 6,664,554 B2 | | 12/2003 | Klebanoff et al. |
| 6,772,776 B2 | * | 8/2004 | Klebanoff et al. ............. 134/1 |
| 2003/0051739 A1 | | 3/2003 | Klebanoff et al. |
| 2004/0011381 A1 | | 1/2004 | Klebanoff et al. |

OTHER PUBLICATIONS

S. Graham, M.E. Malinowski, C.E. Steinhaus, P.A. Grunow and L.E. Klebanoff, "Studies of EUV Contamination Mitigation," Emerging Lithographic Technologies VI, Proceedings of SPIE vol. 4688, p. 431-441, (2002).
Malinowski et al., "Use of Molecular Oxygen to Reduce EUV-induced Carbon Contamination of Optics," Emerging Lithographic Technologies V, Proc. SPIE vol. 4343 pp. 347-356 (2001).
Malinowski, M., Blebanoff, L., Clift, M., Grunow, P., Steinhaus, C. "Carbon Deposition and Removal on Mo/Si Mirrors" (2000).
Johnson, E. D., Hulbert, S. L., Garrett, R. F., Williams, G. P. and Knotek, M. L. "In situ reactive glow discharge cleaning of x-ray optical surfaces," Review of Scientific Instruments vol 58(6) pp. 1042-1045, Jun. 1987.

* cited by examiner

*Primary Examiner*—Zeinab El-Arini
(74) *Attorney, Agent, or Firm*—Fish & Richardson P.C.

(57) ABSTRACT

A method and system for cleaning collector optics in a light source chamber. In producing, for example, extreme ultraviolet light for lithography, debris such as tungsten can accumulate on optical components near a light source in the light source chamber.

An etchant, such as a fluorine-containing gas, can be introduced into the light source chamber. The etchant is ionized via electrodes to generate free fluorine. The electrodes can be, for example, existing light source chamber components including the optical components. The fluorine can then react with the debris, forming gaseous compounds, which are pumped out of the light source chamber.

19 Claims, 8 Drawing Sheets

IN-SITU CLEANING OF LIGHT SOURCE COLLECTOR OPTICS

This description relates to in-situ cleaning of light source collector optics.

BACKGROUND

Lithography is used in the fabrication of semiconductor devices. It is the technique by which the patterns that make up the circuitry of a chip are defined. In lithography, a light-sensitive material coats a wafer substrate, such as silicon, that is exposed to light at some wavelength to reproduce an image of the mask that is used to define each die on the wafer. The mask is usually referred to as a reticle in optical lithography, in that it is separated from the wafer by a series of objective lenses. When the wafer and mask are illuminated, the light-sensitive material, or photoresist, undergoes chemical reactions to produce a replicated pattern of the mask on the wafer. The patterns can then be manipulated in ways to transform the structure or properties of the wafer, which leads to the creation of various semiconductor devices and applications.

The source of the light used in lithography, for example, can be an excimer laser light sources at wavelengths of 248 nm, 193 nm or 157 nm. Extreme Ultraviolet (EUV) light sources, which produce light with a wavelength of approximately 13 nm, can also be used.

EUV light can be produced using a small, hot plasma which will efficiently radiate at a desired wavelength, for example 13.4 nm. The plasma is created in a vacuum chamber, typically by driving a pulsed electrical discharge through the target material, or by focusing a pulsed laser beam onto the target material. The light produced by the plasma is then collected by nearby mirrors and sent downstream to the rest of the lithography tool.

The hot plasma tends to erode any materials nearby, for example the electrodes in electric-discharge sources, or components of the gas delivery system in laser-produced plasmas. The eroded material may then coat the collector optics, resulting in a loss of reflectivity and reducing the amount of light available for lithography.

The collector optics may be replaced once they are coated with a given level of debris. Alternatively, the collector optics could be cleaned, for example, by temporarily removing them from the system for cleaning. The optical components may then be put back in the EUV system, and recalibrated and realigned.

DETAILED DESCRIPTION

Figure 1:
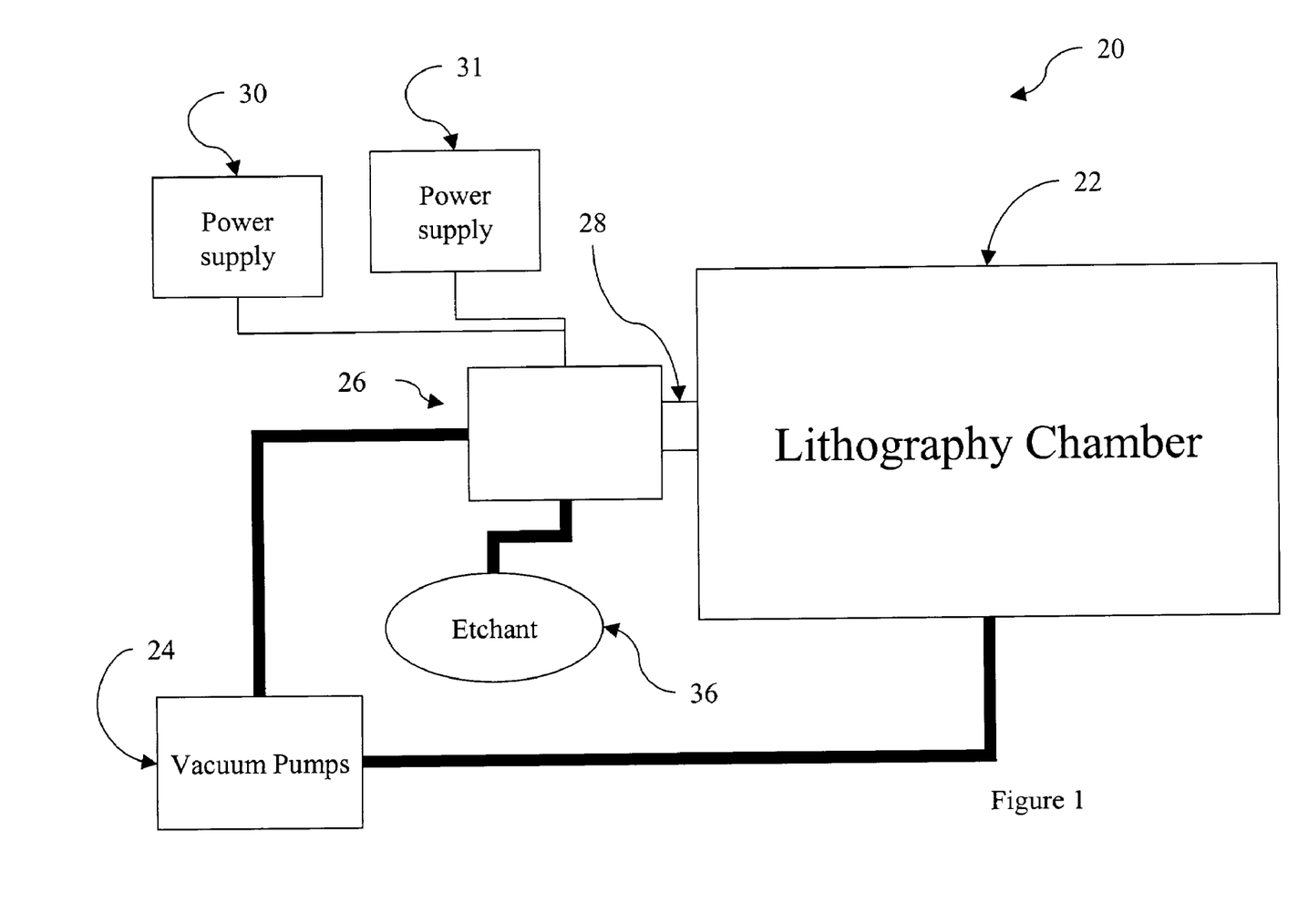
FIG. 1 shows a lithography system.

FIG. 1 shows a lithography system 20. The wafer with the light sensitive coating and the mask are placed in the lithography chamber 22. The pressure in the lithography chamber 22 is reduced to a near vacuum environment by vacuum pumps 24. A light source chamber 26, which houses a light source, is connected to the lithography chamber 22. The pressure in the light source chamber 26 is also reduced to a near vacuum environment by vacuum pumps 24. The light source chamber 26 and lithography chamber 22 are separated by a valve 28 that can be used to isolate the chambers 22, 26. This allows for different environments within each chamber.

The light source chamber 26 can be a EUV chamber, which houses a EUV light source. A power supply 30 is connected to the EUV chamber 26 to supply energy for creating a EUV photon emitting plasma, which provides EUV light for lithography. The light source chamber is evacuated by vacuum pumps 24.

Figure 2:
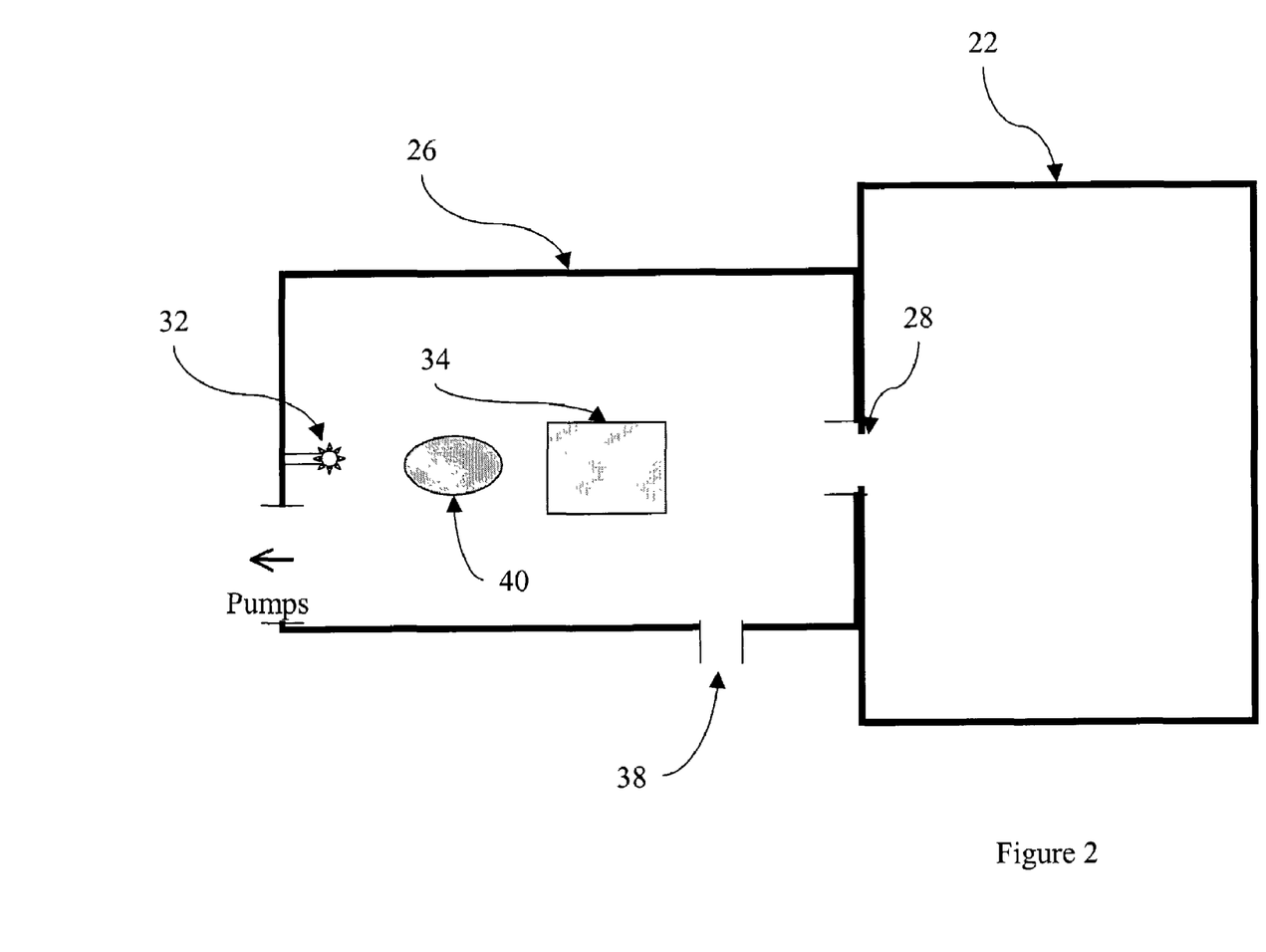
FIG. 2 shows a light source chamber.

FIG. 2 shows the light source chamber 26 connected to the lithography chamber 22. (The valve 28 is shown open.) Inside the light source chamber 26 is a light source 32 and collector optics 34 for collecting and directing the light for use in the lithography chamber 22. As described above, debris may be deposited on the collector optics 34. The collector optics 34 can be cleaned without removing them from the light source chamber 26.

To clean the optics, the light source chamber 26 is first isolated from the lithography chamber 22 by closing the isolation valve 28. The pressure in the light source chamber 26 is reduced using vacuum pumps 24 (FIG. 1), which may be the same pumps as used during light production, or different pumps. An etchant, or chemical reagent used in etching, is supplied from an etchant tank 36 (FIG. 1) to the light source chamber 26 through an etchant valve 38. Etching involves electrically driving a chemical reaction between gaseous reagents introduced into the light source chamber 26 and a surface, such as the surfaces of the collector optics 34. Here, for example, the etchant is ionized to form a plasma 40 by introducing electrical energy from a power supply. The power supply can be the light source power supply 30, or a separate etching power supply 31. (FIG. 1). Alternatively, laser energy could also be used to drive the ionization. The ions in the plasma 40 react with the debris on the surface of the collector optics 34, forming stable gaseous compounds. These stable compounds are then pumped away using the vacuum pumps 24 (FIG. 1). Then the value 28 can be reopened and photolithography can proceed again.

The collector optics can be, for example, grazing incidence mirrors. In a grazing incidence collector configuration, nested shells of mirrors are placed between the source 32 and the isolation valve 28. For example, each shell may be an ellipse of rotation, with the source at one focus of the ellipse, which is then re-imaged at the other focus of the ellipse. Parabolic shells produce a collimated beam of light. More complicated geometries of nested-shell mirrors are also possible.

Figure 3:
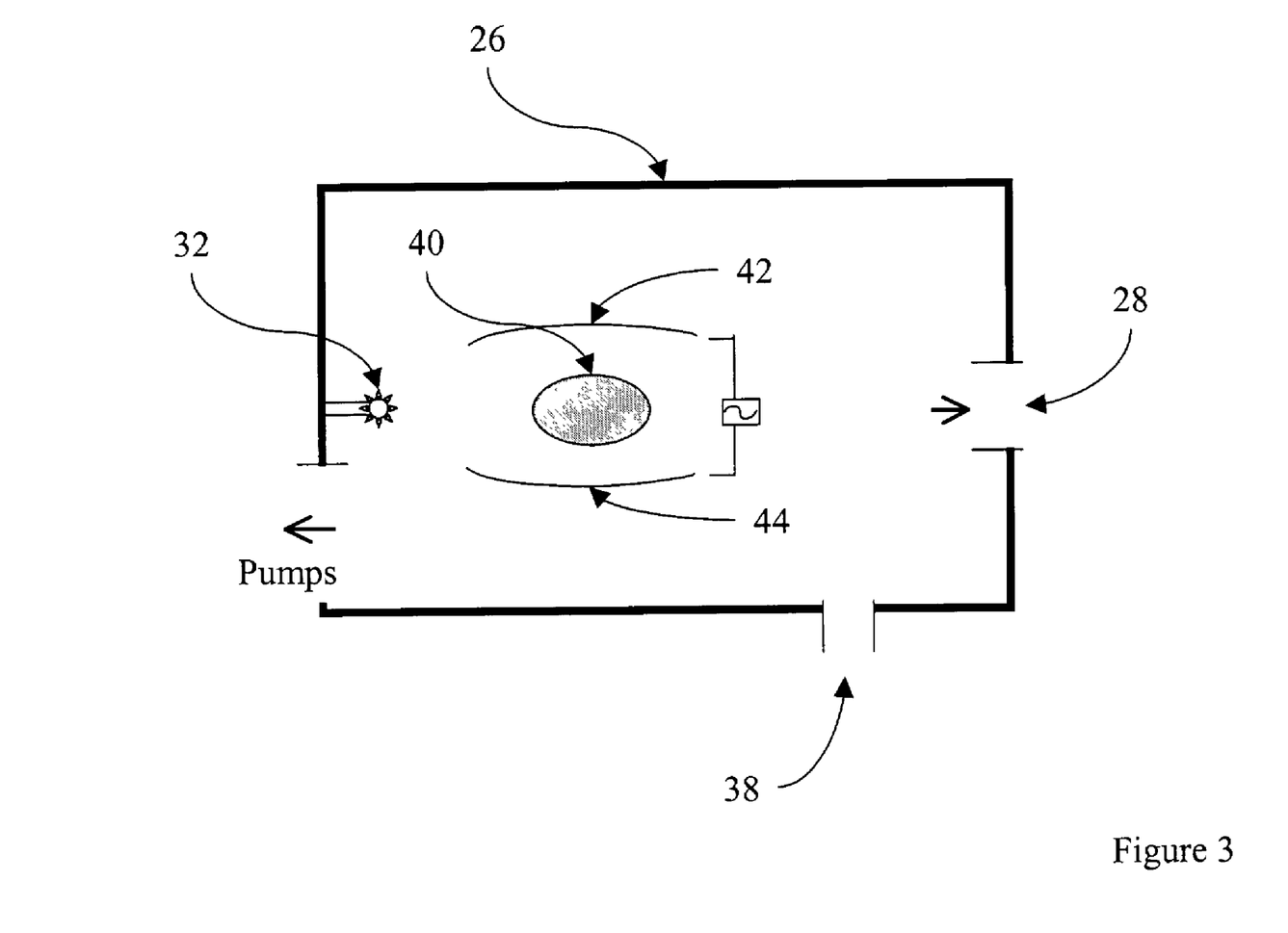
FIG. 3 shows a EUV chamber, modified for etching, including collector optics in a grazing incidence configuration.

Grazing-incidence mirrors can have a metallic surface, allowing the mirrors to be used as electrodes for the purposes of ionizing an etchant gas. FIG. 3 shows an example of a single mirror-shell, electrically split into two halves, 42 and 44. FIG. 3 shows a cross-section of the two parts of the mirror-shell. The complete un-sectioned shell is an essentially closed three-dimensional elliptical surface that is split longitudinally to form the two halves 42, 44. By holding the segments 42 and 44 at different voltages, the etchant can then be ionized to create the plasma 40 between the two mirrors 42, 44. The electrical energy can be supplied, for example, at microwave or radio frequency (RF).

Figure 4:
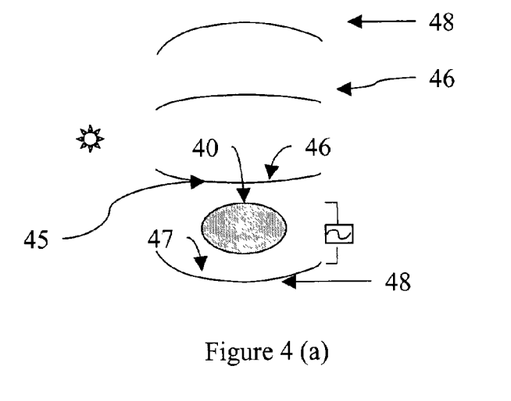
FIGS. 4(a)–(d) show alternative embodiments of an EUV chamber, modified for etching, including collector optics in a grazing incidence configuration.

FIGS. 4(a)–4(d) show other possible grazing incidence mirror configurations where the mirrors are nested (and are, as in FIG. 3, shown in section). The mirrors here can be cleaned in stages. For example, the back side 45 (side further from the plasma 40) of the inner mirror 46 and the front side 47 (side closer to plasma 40) of the outer mirror 48 can be cleaned by creating a plasma between those surfaces as shown in FIG. 4(a). Here, the inner 46 and outer 48 mirrors are used as the electrodes. The front side of the inner mirrors 46 can be cleaned by creating a plasma 40 between the front surface 49 of the mirror 46 and a centerline 50 between the two inner mirrors, as shown in FIG. 4(b). Here, the inner mirror 46 is used as an electrode, and another electrode 52 is placed at the centerline. Alternatively, the front sides 49 of the inner mirrors 46 can be cleaned by creating a plasma 40 between the two inner mirrors 46, as shown in FIG. 4(c). Here, the two inner mirrors 46 are used as electrodes.

Instead of etching in multiple stages, as described above, the mirrors can be simultaneously etched by ensuring that the various mirror components are at the appropriate phases of the alternating voltage. For example, in FIG. 4a, the lower segment of mirror 48 can be at a positive voltage while the lower segment of 46 is at a negative voltage, while at the same time the upper segment of 46 is at positive voltage and the upper segment of 48 is at a negative voltage.

A segmented mirror configuration can also be used. A surface view of a segmented mirror is shown in FIG. 4(d). In this configuration, each of the mirrors is divided into multiple segments 54 along its length. Neighboring segments are held at opposite potentials to ionize the etchant. The segments can also be split along the lengthwise direction. Combinations of segmenting and nesting can also be used.

Figure 5:
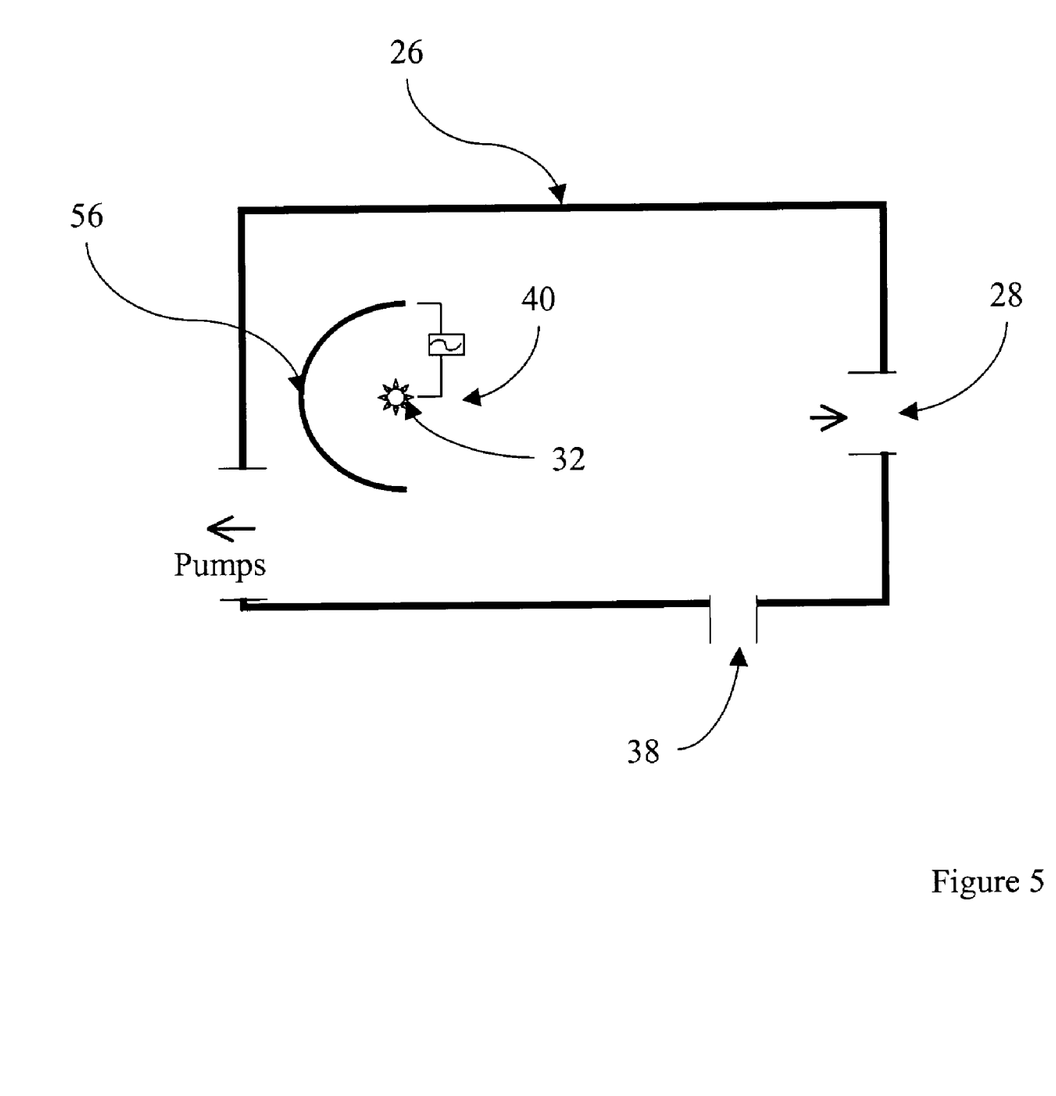
FIG. 5 shows a EUV chamber, modified for etching, including collector optics in a normal incidence configuration.

A normal-incidence mirror configuration, shown in FIG. 5, can also be used to direct the light into the lithography chamber 22. Here, the mirror 56 is a section of a rotated ellipse, parabola, or more complicated shape, that surrounds the source 32, causing the individual light rays to re-direct an angle close to 180 degrees. Nested and segmented configurations, similar to those described for grazing-incidence collectors, can also be used. Alternatively, the source itself 32 can be used as one of the electrodes, with the mirror 56 as the other electrode held at opposite voltage.

By introducing other metallic pieces into the chamber, many other mirror-electrode combinations are possible for both grazing-incidence and normal-incidence mirror configurations.

Mirrors in a grazing-incidence configuration require a smooth surface of certain EUV-reflective metals. Ruthenium, for example, can be used, as it is relatively tough and has a high grazing-incidence EUV reflectance. Normal-incidence mirrors require a multilayer coating, such as multiple layers of Si and Mo, to be reflective to EUV. A protective capping layer of another material can also be used with the multi-layer mirrors, for example, ruthenium or $SiO_2$.

The debris deposited on the mirrors can be composed of the materials making up the plasma-facing components of the EUV source. For example, tungsten (W) can be used for such components, as it is relatively resistant to plasma erosion. Specifically, tungsten can be used in the electrodes of an electric-discharge source and in the heat shields surrounding the gas-delivery system of a laser-produced plasma. The debris deposited on the mirrors determines the etchant that can be used to clean the mirrors.

Figure 6:
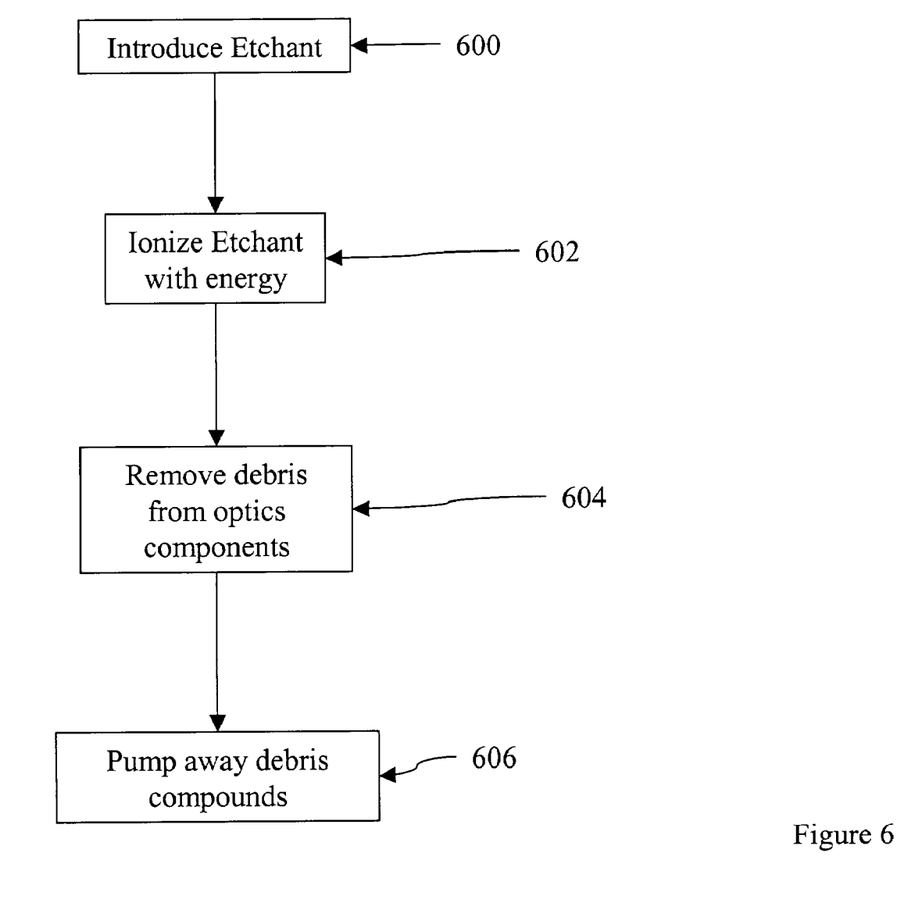
FIG. 6 is a flowchart for a method of removing debris from lithography optics.

The etchant is chosen such that when ionized, the ions react with the debris to form a volatile substance, which is gaseous in the light source chamber, while not reacting with the mirror surfaces to form volatile substances. Volatile substances are those that assume a gaseous form in the environment inside the light source chamber. If the debris deposited on the mirrors is tungsten, a fluorine-containing gas can be used as an etchant. Ruthenium and $SiO_2$, examples of materials that can be used in the mirrors, do not react with fluorine atoms to form volatile substances. Examples of fluorine-containing gases include $SF_6$, $F_2$, $XeF_2$ and $NF_3$. Other fluorine-containing gases can be used as well. As FIG. 6 shows, the etchant is introduced into the chamber (step 600). It is then ionized to form free fluorine (step 602). The free fluorine is generated through plasma electron collisions with the etchant gas.

The free fluorine atoms then react with the solid tungsten debris to form tungsten-fluorine compounds such as tungsten hexafluoride (step 604). Tungsten hexafluoride is a relatively volatile compound, with a boiling temperature of about 20C. at 1 atm, and thus will be a gas that can be pumped out of the chamber (step 606).

Figure 7:
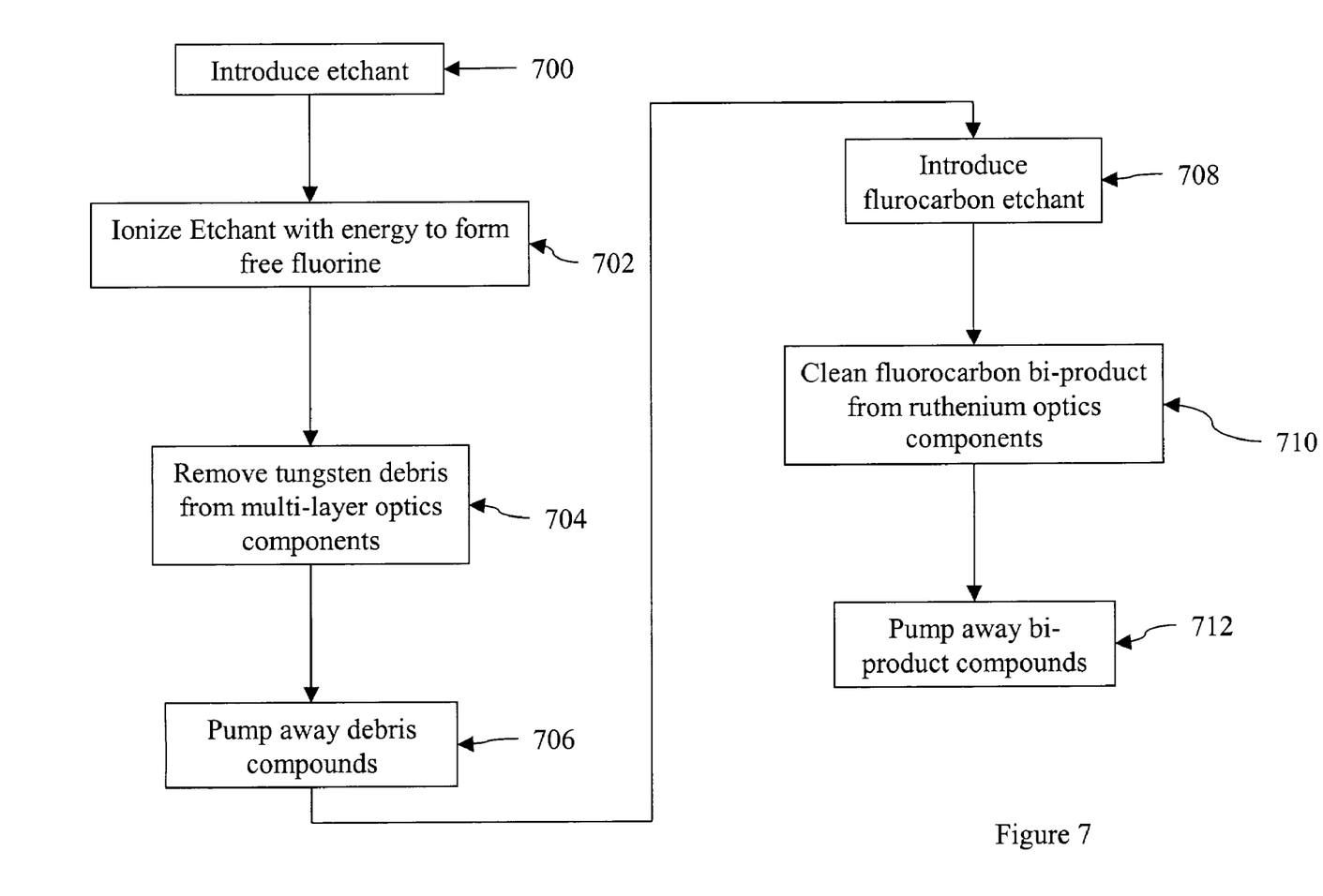
FIG. 7 is a flowchart for a method of removing byproduct from EUV lithography optics.

If a multi-layer material is used in the mirrors, debris should be removed from only the outer or capping layer. This requires a more precise etch. If the debris includes tungsten, a fluorocarbon can be used as the etchant, as shown in FIG. 7. Examples of possible fluorocarbon etchants include $CF_4$, $CHF_3$, and $C_4F_8$, though there are many other possibilities. Fluorocarbon etchants can also be used for cleaning solid metal mirrors. The fluorocarbon etchant is introduced (step 700) and ionized to form free fluorine atoms (step 702).

The free fluorine atoms (F) react with the tungsten debris (step 704). Thus the tungsten is removed from the mirror and can be pumped away (step 706).

As a side effect of using fluorocarbon etchants, fluorocarbon chains such as $CF_2$ and $CF_3$ can form with tungsten, leaving a residue on the surface of the mirrors. A second plasma can be created to remove this residue from the mirrors. Hydrogen or oxygen can be introduced as etchants for the second plasma (step 708). Free hydrogen or oxygen is generated through plasma electron collisions with the etchant gas. The free oxygen or hydrogen reacts with the fluorocarbon-tungsten compounds. Methane ($CH_4$) or carbon monoxide (CO) is formed along with a tungsten-fluorine compound (such as tungsten hexaflouride) and both are pumped out of the chamber.

Generation of EUV light can also crack hydrocarbon chains. Thus in addition to tungsten, carbon debris can then be deposited on the optical components. A plasma created using an oxygen etchant can be used to remove the carbon debris.

Figure 8:
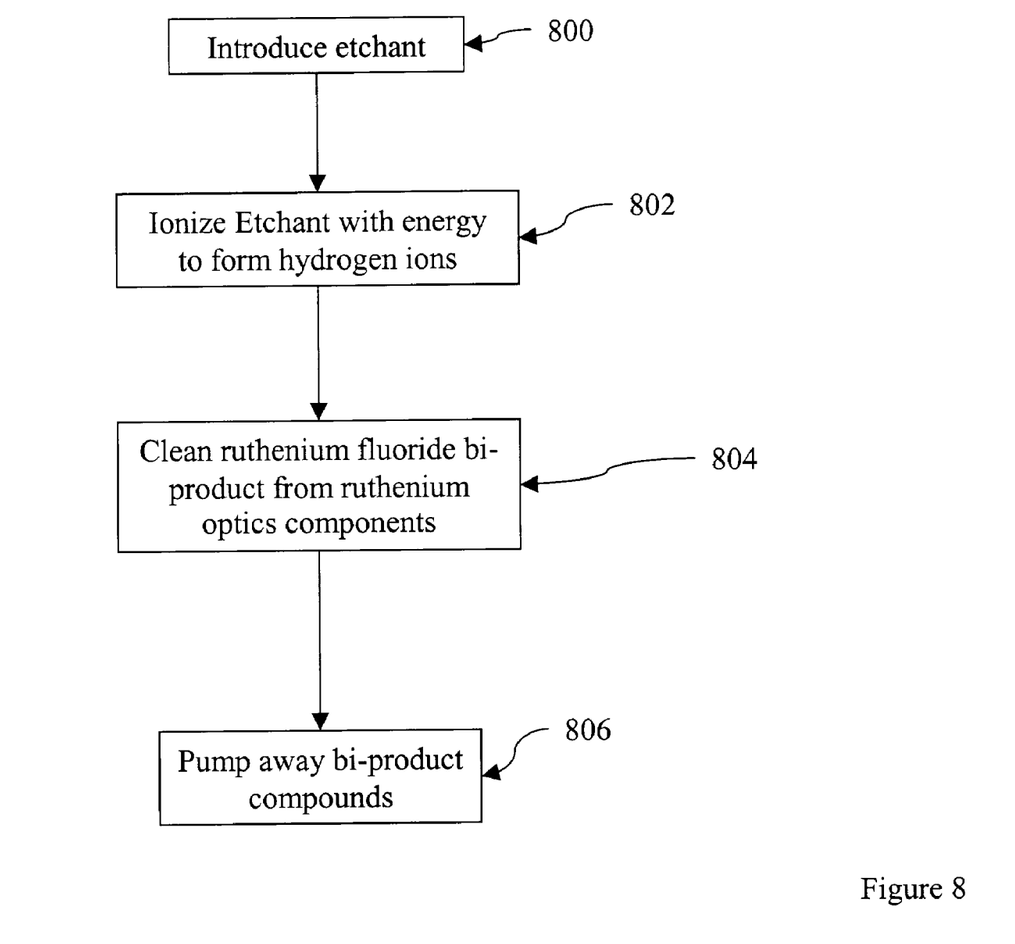
FIG. 8 is a flowchart for a method of removing byproduct from EUV lithography optics.

If the debris deposition is not uniform across the mirror, there may be regions of exposed mirror without debris on top that can potentially react with the fluorine atoms. For example, if the mirror is made of ruthenium, the areas on the mirror surface not covered by debris can potentially react with the fluorine atoms to form ruthenium fluoride on the mirror surface. An additional plasma can be created to clean the ruthenium fluoride, as FIG. 8 shows. Hydrogen reactive ion etching (RIE) at room temperature, where hydrogen is used as the etchant, can be used to remove the ruthenium fluoride from the mirror without reacting with the ruthenium on the mirror surface. Hydrogen is introduced into the chamber (step 800), is ionized (step 802) and reacts with ruthenium fluoride to form HF gas (step 804), which can be readily pumped away from the chamber (step 806), leaving a clean ruthenium surface.

If the debris deposited on the mirrors is a material other than tungsten, the etchant can be chosen such that when ionized, free ions in the plasma react with the debris to form gaseous compounds, which can be pumped away.

An alternative to reacting a plasma with debris on the mirror surfaces is to sputter debris off the mirror surfaces. In this case, a high-energy plasma is created in the light source chamber. The plasma ions strike the surface of the collector optics and dislodge particles of debris such as tungsten, aluminum, copper, and other impurities. The energy and composition of the ions are be tuned so as to minimize the damage to the mirror surface and maximize the damage to the debris. A sputtering plasma can be created with any of the mirror configurations described above. Also, sputtering may be used in conjunction with the other methods described above.

Although some implementations have been described above, other embodiments are also within the scope of the invention.

What is claimed:

1. A fabrication system comprising:
   a lithographic light source in a first chamber;
   optics in the first chamber to control light from the light source;
   a first etchant source connected to the first chamber to introduce a first etchant into the first chamber; and
   an energy source to ionize the first etchant.

2. The system of claim 1, in which the light source comprises an extreme ultraviolet energy source.

3. The system of claim 1, in which the optics comprise at least one mirror.

4. The system of claim 3, in which a surface of the mirror comprises ruthenium.

5. The system of claim 3, in which a surface of the mirror comprises a multi-layer material.

6. The system of claim 3, in which a surface of the mirror comprises silicon.

7. The system of claim 1, in which the optics comprise grazing incidence collectors.

8. The system of claim 1, in which the optics comprise at least one normal-incidence collector.

9. The system of claim 1, in which the energy source is connected between the light source and the optics to create a bias between the light source and the optics.

10. The system of claim 1, in which the energy source is connected between two components of the optics to create a bias between the two components.

11. The system of claim 1, further comprising:
    a lithography chamber; and
    a valve between the first chamber and the lithography chamber to isolate the first chamber from the lithography chamber.

12. The system of claim 1, further comprising a second etchant source connected to the first chamber to introduce a second etchant into the first chamber.

13. The system of claim 12, in which the second etchant source comprises one of a hydrogen source and an oxygen source for introducing one of hydrogen and oxygen into the first chamber.

14. The system of claim 1, in which the first etchant source comprises a fluorine-containing gas source to introduce a fluorine-containing gas into the first chamber.

15. The system of claim 1, in which the first etchant source comprises a fluorocarbon etchant source to introduce a fluorocarbon etchant into the first chamber.

16. The system of claim 1, in which the light source comprises an extreme ultraviolet light source.

17. The system of claim 16, in which the optics comprise grazing incidence collectors of extreme ultraviolet light.

18. The system of claim 1, in which the energy source to ionize the first etchant is also to ionize a gas to an EUV-emitting plasma.

19. The system of claim 1, further comprising a second energy source to ionize a gas to an EUV-emitting plasma.

* * * * *